(12) United States Patent
Cannavo et al.

(10) Patent No.: US 11,462,996 B2
(45) Date of Patent: Oct. 4, 2022

(54) METHOD FOR REDUCING ELECTROMAGNETIC DISTURBANCES GENERATED DURING THE SWITCHING OF A TRANSISTOR INTO THE CONDUCTING STATE

(71) Applicant: VITESCO TECHNOLOGIES GmbH, Hannover (DE)

(72) Inventors: Jean Cannavo, Toulouse (FR); Michael Ernst, Toulouse (FR)

(73) Assignee: VITESCO TECHNOLOGIES GMBH, Hannover (DE)

( * ) Notice: Subject to any disclaimer, the term of this patent is extended or adjusted under 35 U.S.C. 154(b) by 0 days.

(21) Appl. No.: 17/257,444

(22) PCT Filed: Jul. 9, 2019

(86) PCT No.: PCT/EP2019/068390
§ 371 (c)(1),
(2) Date: Dec. 31, 2020

(87) PCT Pub. No.: WO2020/020631
PCT Pub. Date: Jan. 30, 2020

(65) Prior Publication Data
US 2021/0359596 A1 Nov. 18, 2021

(30) Foreign Application Priority Data

Jul. 10, 2018 (FR) ...................................... 1856317

(51) Int. Cl.
*H02M 1/44* (2007.01)
*H02M 1/08* (2006.01)
(Continued)

(52) U.S. Cl.
CPC ............... *H02M 1/44* (2013.01); *H02M 1/08* (2013.01); *H02M 3/155* (2013.01); *H03K 19/20* (2013.01)

(58) Field of Classification Search
USPC ......................................... 307/10.1
See application file for complete search history.

(56) References Cited

U.S. PATENT DOCUMENTS 5,940,287 A * 8/1999 Brkovic ............ H02M 3/33592
  323/283
8,199,544 B2 * 6/2012 Krause ................ H02M 7/5387
  363/17

(Continued)

OTHER PUBLICATIONS

International Search Report for PCT/EP2019/068390 dated Sep. 20, 2019, 5 pages.

(Continued)

*Primary Examiner* — Daniel C Puentes
*Assistant Examiner* — Khareem E Almo
(74) *Attorney, Agent, or Firm* — Nixon & Vanderhye

(57) ABSTRACT

Disclosed is a method for reducing the electromagnetic interference produced during the switching to the on state of a transistor for switching a quasi-resonant DC-DC voltage converter. The method includes the steps of: the transistor being initially controlled so as to be in the on state on the basis of a first control current, controlling the driving module by way of the control module so that the driving module switches the transistor to the off state at a first instant; and triggering the timer from the first instant, and, if the timer reaches a predefined duration threshold, controlling, by means of the driving module, the transistor so as to be in the on state on the basis of a second control current the intensity of which is lower than the intensity of the first control current.

20 Claims, 1 Drawing Sheet

(51) Int. Cl.
*H02M 3/155* (2006.01)
*H03K 19/20* (2006.01)

(56) References Cited

U.S. PATENT DOCUMENTS

| | | | | |
|---|---|---|---|---|
| 10,673,337 | B1* | 6/2020 | Jodka | H02M 1/088 |
| 11,295,787 | B1* | 4/2022 | Gunther | H02M 1/0032 |
| 2004/0012986 | A1* | 1/2004 | Riggio | H02M 3/00 |
| | | | | 363/26 |
| 2009/0237052 | A1 | 9/2009 | Takasu et al. | |
| 2012/0049822 | A1 | 3/2012 | Li et al. | |
| 2012/0262953 | A1* | 10/2012 | Jungreis | H02M 3/33569 |
| | | | | 363/21.02 |
| 2012/0286752 | A1* | 11/2012 | Tsukiji | H04N 5/63 |
| | | | | 323/282 |
| 2013/0200927 | A1* | 8/2013 | Asam | H03K 17/0822 |
| | | | | 327/109 |
| 2013/0322125 | A1* | 12/2013 | Kimmer | H03K 17/163 |
| | | | | 363/16 |
| 2013/0343098 | A1* | 12/2013 | Kern | H02M 3/33569 |
| | | | | 363/21.12 |
| 2016/0172961 | A1* | 6/2016 | Deng | H02M 3/158 |
| | | | | 327/109 |
| 2017/0085183 | A1* | 3/2017 | Notsch | H02M 1/44 |
| 2018/0287494 | A1* | 10/2018 | Yano | H02J 7/00 |
| 2018/0331682 | A1* | 11/2018 | Duduman | H02M 1/38 |
| 2020/0287457 | A1* | 9/2020 | Su | H02M 3/33523 |
| 2021/0159800 | A1* | 5/2021 | Romanov | H02M 3/33569 |
| 2021/0242789 | A1* | 8/2021 | Su | H02M 1/44 |

OTHER PUBLICATIONS

Written Opinion of the ISA for PCT/EP2019/068390 dated Sep. 20, 2019, 7 pages.

* cited by examiner

METHOD FOR REDUCING ELECTROMAGNETIC DISTURBANCES GENERATED DURING THE SWITCHING OF A TRANSISTOR INTO THE CONDUCTING STATE

CROSS-REFERENCE TO RELATED APPLICATIONS

This application is the U.S. national phase of International Application No. PCT/EP2019/068390 filed Jul. 9, 2019 which designated the U.S. and claims priority to FR 1856317 filed Jul. 10, 2018, the entire contents of each of which are hereby incorporated by reference.

BACKGROUND OF THE INVENTION

Field of the Invention

The present invention relates to the field of DC-DC voltage converters and more particularly to a method for reducing the electromagnetic interference produced during the switching to the on state of a transistor for switching a quasi-resonant DC-DC voltage converter.

Description of the Related Art

A DC-DC voltage converter makes it possible to transform an input voltage, for example of 12 V, delivered by a power-supply battery into a higher output voltage, for example of 65 V, or vice versa. The principle consists in charging a coil with current and in interrupting the current cyclically, using a switch, notably a transistor, for example of MOS type.

In such a solution, the alternation between switching to the on state and to the off state of the switch generates losses called "switching" losses. More precisely, these losses are produced when current is still flowing in the coil, and when the transistor has a positive voltage across its terminals, when switching the transistor to the on state (called switching "ON" by a person skilled in the art), the losses increasing with the intensity of the currents flowing simultaneously in the coil and in the transistor and with the voltage across the terminals of the transistor. Now, it is important to manage these losses because they significantly reduce the efficiency of the converter.

One solution which makes it possible to reduce switching losses, known under the name of "quasi-resonant" DC-DC converter, consists in synchronizing the triggering of the instant at which the transistor is switched to the on state with the time interval (called the "resonance" interval) during which the intensity of the current flowing in the coil is zero or negative (i.e. flowing in the opposite direction), and the voltage across the terminals of the transistor is minimal (or, better still, zero or negative). To this end, the converter comprises a resonance capacitor connected between the drain and the source of the transistor and a gate resistor connected to the gate of the transistor.

However, on switching on the converter, for example after an interruption, time is required to establish the quasi-resonant state. Thus, when the transistor switches to the on state for the first time when it is switched on while the converter is not yet in quasi-resonant mode, the input voltage discharges into the transistor and the resonance capacitor, and produces emissions radiated by the transistor, which then acts like an antenna. The lower the gate resistance value is, for example of the order of 4 ohms, the faster the discharge is, to guarantee a fast discharge of the coil allowing the time taken for switching the transistor to the on state to be short. The effect of this interference is a risk of exceeding the desired relative electromagnetic emission limits for such a converter.

In order to overcome this drawback at least in part, one known solution consists in using, instead of a single gate resistor, two gate resistors of different values connected in parallel, and one of which, of lower value, is connected in series with a diode which lets only the current coming from the gate of the transistor pass through. Thus, the current for switching the transistor to the on state passes through the gate resistor of higher value while the current coming from the gate of the transistor when it is switched to the off state (discharge) flows into the gate resistor of low value and the diode. Because of this, since the current for switching the transistor to the on state is significantly lower than the current for switching it to the off state, the current flowing in the transistor upon the switching on of the converter is lower, which reduces radiated emissions and electromagnetic interference. However, the low value of the current increases the time taken to switch the transistor to the on state, which may generate delays such that the switching of the transistor to the on state no longer coincides with the resonance time interval during which the intensity of the current flowing in the coil is zero or negative and the voltage across the terminals of the transistor is minimal, such delays possibly then also causing electromagnetic interference.

SUMMARY OF THE INVENTION

There is therefore a need for a simple, fast, reliable, low-cost and efficient solution which makes it possible to limit electromagnetic interference.

To this end, the subject of the invention is first of all a method for reducing the electromagnetic interference produced during the switching to the on state of a transistor for switching a quasi-resonant DC-DC voltage converter, said converter comprising a control module, an induction coil, a field-effect transistor and a driving module supplied with a current delivered by a power supply, said transistor comprising a drain, a source and a gate, said gate being connected to the driving module, the control module being configured to control the driving module in order that said driving module controls the transistor, on the basis of a control current, so as to be in an on state allowing the current to pass between the drain and the source or so as to be in an off state blocking the current between the drain and the source, said method being noteworthy in that, the driving module comprising a timer, it comprises the steps of:

the transistor being initially controlled so as to be in the on state on the basis of a first control current, controlling the driving module by means of the control module so that said driving module switches the transistor to the off state at a first instant, triggering the timer from said first instant, if the timer reaches a predefined duration threshold, controlling, by means of the driving module, the transistor so as to be in the on state on the basis of a second control current the intensity of which is lower than the intensity of the first control current.

The expression "controlling . . . the transistor so as to be in the on state on the basis of a second control current" is understood to mean the following controlling (or next controlling) of the transistor.

The method according to the invention makes it possible to reduce the intensity of the control current for controlling the gate of the transistor for as long as the converter is in the transient state before reaching its steady state, in which it is quasi-resonant. This notably makes it possible to avoid the transistor being controlled with a strong current, thus preventing the generation of electromagnetic interference by said transistor without however bringing about overheating (which could be caused by a continuous slow switching).

However, if the timer does not reach the predefined duration threshold, then the intensity of the (following) control current is not modified.

Preferably, the predefined duration threshold is between 10 and 50 µs.

Further preferably, the decrease in the intensity of the control current for controlling the transistor is of the order of 75 to 90% of its initial value. Said initial value being equal to the intensity of the current of the gate of the transistor delivered by the power supply in the nominal case where the converter is operating in quasi-resonant mode.

According to one aspect of the invention, if the timer does not reach the predefined duration threshold, then the intensity of the control current is maintained at its nominal value (i.e. the first control current is used).

The invention also relates to a quasi-resonant DC-DC voltage converter for a motor vehicle, said converter comprising a control module, an induction coil, a field-effect transistor and a driving module supplied with a current delivered by a power supply, said transistor comprising a drain, a source and a gate, said gate being connected to the driving module, the control module being configured to control the driving module in order that said driving module controls the transistor, on the basis of a control current, so as to be in an on state allowing the current to pass between the drain and the source or so as to be in an off state blocking the current between the drain and the source, said converter being noteworthy in that, the driving module comprising a timer, the converter is configured to:

the transistor being initially controlled so as to be in the on state on the basis of a first control current, control the driving module so that said driving module switches the transistor to the off state at a first instant, trigger the timer from said first instant, when the timer reaches a predefined duration threshold, control the transistor so as to be in the on state on the basis of a second control current the intensity of which is lower than the intensity of the first control current.

Preferably, the converter is configured to decrease the intensity of the control current for controlling the transistor so as to be in its on state until the next switching of said transistor to the off state.

In one embodiment, the driving module comprises a first switch and a second switch which are connected in series via a midpoint, said first switch being connected on one side to the power supply and on another side to said midpoint, said second switch being connected on one side to the midpoint and on another side to ground.

Preferably, the first switch is a transistor for switching the field-effect transistor to the on state (switching it ON) and the second switch is a transistor for switching the field-effect transistor to the off state.

According to one aspect of the invention, the driving module further comprises a third switch, a first driver, configured to switch the first switch, a second driver, configured to switch the second switch, and a driving unit for driving the third switch, configured to switch said third switch.

In one preferred embodiment, the driving unit comprises the timer, two NOT-type logic gates, two AND-type logic gates and a logic latch, for example of "RS-Q" type.

In a preferred manner, the driving module comprises a current measurement unit.

Lastly, the invention relates to a motor vehicle comprising a converter such as presented above.

BRIEF DESCRIPTION OF THE DRAWINGS

Other features and advantages of the invention will become apparent from the following description, given with reference to the appended figures that are given by way of non-limiting examples and in which identical references are given to similar objects.

DESCRIPTION OF THE PREFERRED EMBODIMENTS

Figure 1:
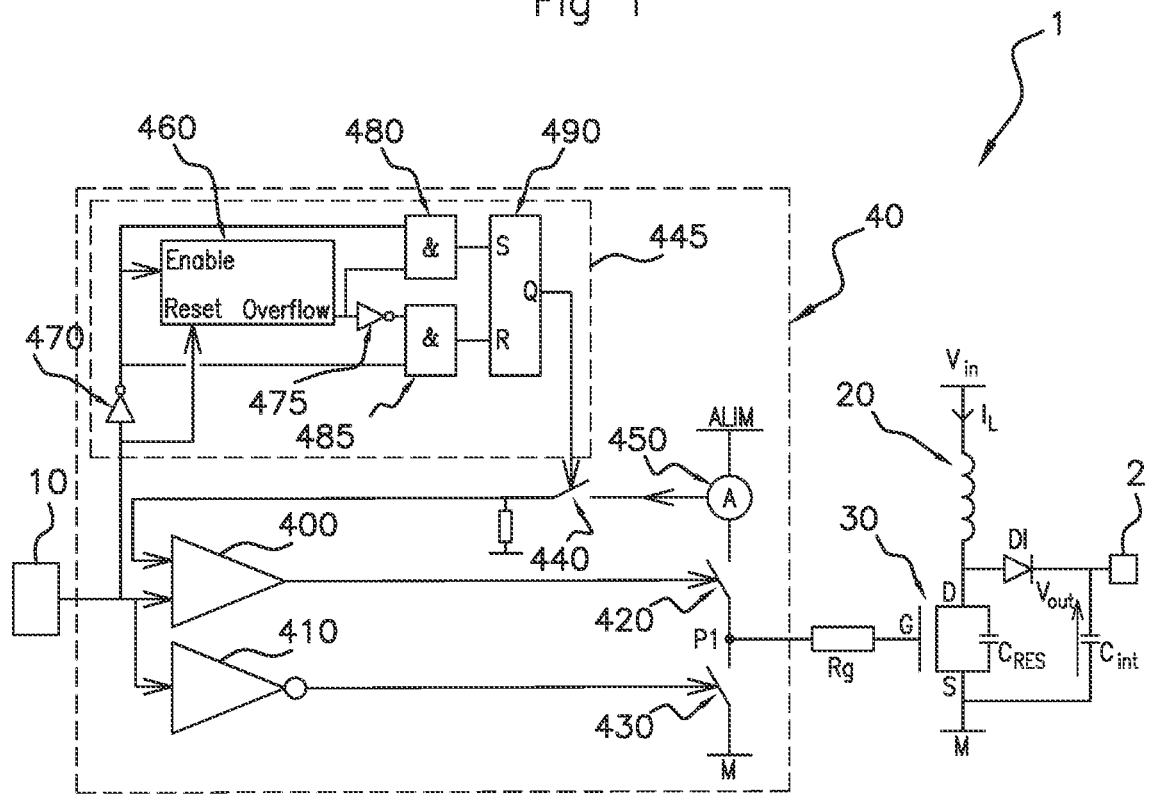
FIG. 1 illustrates one embodiment of the converter according to the invention.

FIG. 1 shows one example of a converter 1 according to the invention. The converter 1 is intended to be installed in a motor vehicle, for example in order to deliver an output voltage for controlling fuel injectors 2. The converter 1 is a quasi-resonant DC-DC voltage converter 1.

In the example described hereinbelow, but in a non-limiting manner, the converter 1 is a boost converter 1 for charging a capacitor called an "intermediate" capacitor Cint delivering the power required to activate the fuel injectors 2.

The converter 1 transforms an input voltage Vin (input current $I_L$) delivered by the battery of the vehicle into an output voltage Vout applied across the terminals of the intermediate capacitor Cint, the voltages being measured with respect to ground M.

The converter 1 comprises a control module 10, an induction coil 20, a field-effect transistor 30 and a driving module 40.

The induction coil 20 is connected at the input of the circuit so as to be charged when it is passed through by the input current $I_L$.

A diode DI is connected between the induction coil 20 and the high terminal of the intermediate capacitor Cint which corresponds to the output of the converter 1 connected to the injectors 2. The diode DI is conducting from the induction coil 20 to the intermediate capacitor Cint but blocking from the intermediate capacitor Cint to the induction coil 20 in order to prevent the intermediate capacitor Cint from discharging into the converter 1.

The transistor 30 comprises a drain D, a source S and a gate G, said gate G being connected to the driving module 40 in order that said driving module 40 controls the transistor 30 so as to be in an on state allowing the current to pass between the drain D and the source S or in an off state blocking the current between the drain D and the source S. The source S is connected to ground M and the gate G is connected to the driving module 40 via a gate resistor Rg. A capacitor Cres is connected in parallel with the transistor 30, between the drain D and the source S, in order to make the converter 1 quasi-resonant.

The voltage measured at the drain D takes, on the interrupting of the transistor 30, the form of a square wave followed by a damped sinusoidal oscillation centered around the input voltage of the converter 1 and characterized by its period.

The control module 10 is configured to send control signals to the driving module 40 in order that said driving module 40 controls the gate G of the transistor 30 so that said transistor 30 switches to an on state or to an off state. In other words, the driving module 40 is configured, when it is controlled by the control module 10, to generate a current for controlling the gate G of the transistor 30. Preferably, the control signal originating from the control module 10 is of pulsed binary type and makes it possible for the driving module 40 to know whether the transistor 30 has to be controlled so as to be in the on state (pulse 0=>1=>0).

The driving module 40 is configured, the transistor 30 initially being in the on state, to control the transistor 30 so as to be in the off state at a first instant, to trigger a timer 460 from said first instant, to generate a current for controlling the transistor 30 at a second instant in order that said transistor 30 switches to the on state, to stop the timer 460 at said second instant, and, if the duration elapsed between the first instant and the second instant is longer than a predefined duration threshold, to decrease the intensity of the current for controlling the transistor 30 so as to be in its on state until the next switching of said transistor 30 to the off state.

To this end, in the embodiment illustrated in FIG. 1, the driving module 40 comprises a first driver 400, a second driver 410, a first switch 420, a second switch 430, a third switch 440, a driving unit 445 for driving the third switch 440 and a current measurement unit 450.

The first switch 420 and the second switch 430 are connected in series via a midpoint P1. The first switch 420 is connected on one side to a power supply ALIM and on another side to said midpoint P1. The second switch 430 is connected on one side to the midpoint P1 and on another side to ground M.

Preferably, the first switch 420 is a transistor for switching the field-effect transistor 30 to the on state (switching it ON) and the second switch 430 is a transistor for switching the field-effect transistor 30 to the off state. Preferably, the third switch 440 is floating and allows, by closing the switching ON current feedback loop, said switching ON current to be reduced.

The first driver 400 is configured to switch the first switch 430 between a closed position in which it allows the passage of the current (on state) and an open position in which it prevents the passage of the current (off state).

Likewise, the second driver 410 is configured to switch the second switch 430 between a closed position in which it allows the passage of the current (on state) and an open position in which it prevents the passage of the current (off state).

The driving unit 445 for driving the third switch 440 is configured to switch said third switch 440 to allow the regulation of the current passing through the first switch 420 when said first switch 420 controls the transistor 30 so as to be in the on state.

In the preferred embodiment illustrated in FIG. 1, the driving unit 445 comprises a timer 460, a first NOT-type logic gate 470, a second NOT-type logic gate 475, a first AND-type logic gate 480, a second AND-type logic gate 485 and an "RS-Q"-type logic latch 490.

The current measurement unit 450 makes it possible to measure the current flowing in the third switch 440 when said third switch 440 is closed (on state).

The first driver 400 comprises a first input, which receives the control signal originating from the control module 10, and a second input, which receives, from the current measurement unit 450, the measurement of the current flowing in the third switch 440 when said third switch 440 is closed (on state), notably when it is switched to the on state, in order that the first driver 400 reduces the intensity of the current passing through the first switch 420 when said first switch 420 controls the transistor 30 so as to be in the on state. The output of the first driver 400 makes it possible to control the first switch 420 so as to be open (off state) or so as to be closed (on state).

The second driver 410 is of inverter type. The second driver 410 receives the control signal delivered by the control module 10 and augments it to control the second switch 430.

The first NOT-type logic gate 470 allows the triggering of the timer 460 when the control signal coming from the control module 10 has 0 as its value (i.e. is zero).

Thus, when the first driver 400 and the second driver 410 receive one and the same control signal from the control module 10, they simultaneously open or close the first switch 420 and the second switch 430 to control the transistor 30 so as to be in the on state or so as to be in the off state. More precisely, when the control module 10 sends a control signal received with the binary value 1, the first driver 400 controls the first switch 420 so as to be closed while the second driver 410 controls the second switch 430 so as to be open. In this case, the current flowing in the first switch 420 and the gate resistor Rg controls the gate G of the transistor 30 such that the connection between the drain D and the source S of the transistor 30 is conducting (transistor 30 in the on state). Conversely, when the control module 10 sends a control signal received with the binary value 0, the first driver 400 controls the first switch 420 so as to be open while the second driver 410 controls the second switch 430 so as to be closed. In this case, the voltage of the gate G of the transistor 30 drops and a discharge current passes through the gate resistor Rg and the second switch 420. The drop in the gate G voltage below the conduction threshold of the transistor 30 interrupts the connection between the drain D and the source S of the transistor 30 such that the current which was flowing between said drain D and said source S is also interrupted (transistor 30 in the off state).

The timer 460 includes a first input, a second input and an output. The timer 460 is triggered when a binary signal of value 1 is received at the first input. The timer 460 is reset to zero when a binary signal of value 1 is received at the second input (commonly called "Enable"). A signal of binary value 1 is generated at the output when the timer 460 reaches a predefined duration threshold, that is to say when the timer 460 has been triggered without being reset to zero (by its input commonly called "Reset") for a duration at least equal to the predefined duration threshold.

This predefined duration threshold is chosen so as to differentiate the transient state and the steady state of operation of the quasi-resonant converter 1. Specifically, when the converter 1 is activated after a rest period, for example when the vehicle is started using the ignition key, an initial period called the "transient-state" period is required for the converter 1 before becoming quasi-resonant. During this period, the time that elapses between a switching of the transistor 30 to the off state and the subsequent switching of the transistor 30 to the on state is relatively long while it is shorter in the steady state, for which the converter 1 is quasi-resonant. Now, it is in this transient state that substantial electromagnetic interference may be produced. Thus, the predefined duration threshold is set so as to distinguish the transient state from the steady state. For example, the predefined duration threshold may be between 5 and 50 μs.

Figure 2:
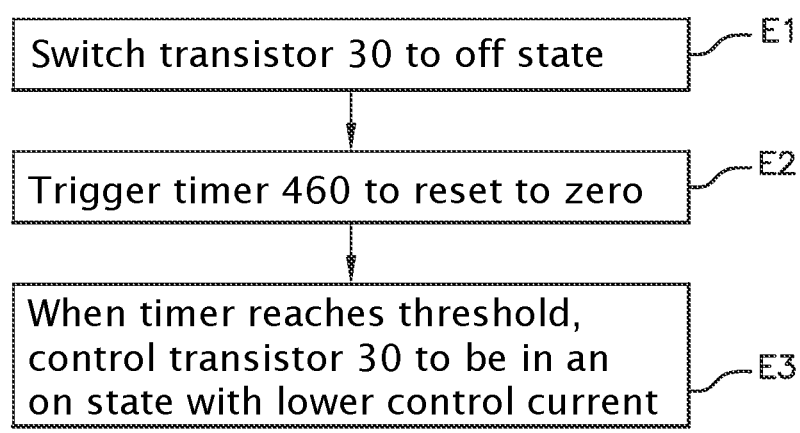
FIG. 2 illustrates one embodiment of the method according to the invention.

One exemplary implementation of the circuit of FIG. 1 will now be described with reference to FIG. 2.

The transistor 30 is initially in the on state while being controlled by a first control current delivered by a regulated voltage, in this instance the power-supply ALIM voltage.

First of all, the control module 10 controls, in a step E1, the driving module 40 in order that said driving module 40 switches the transistor 30 to the off state. More precisely, the control module 10 sends a control signal with the binary value 0 in order that the transistor 30 switches to the off state. This control signal is received simultaneously by the first driver 400, which then controls the first transistor 420 so as to be open (the value of the binary signal being 0), and by the second driver 410, which then controls the second switch 430 so as to be closed (the value of the augmented binary signal being 1) such that the transistor 30 switches to the off state at a first instant.

The control signal augmented with the value 1 by the first NOT-type logic gate 470 also triggers the timer 460 at said first instant, in a step E2. The timer 460 will subsequently be reset to zero when said timer 460 receives a binary value 1 at its zero-reset input.

If the duration measured by the timer 460 reaches the predefined duration threshold (i.e. if the timer has not been reset to zero when a duration equal to the predefined duration threshold has elapsed) before the control module 10 sends a control signal with the binary value 1, then a signal of binary value 1 is generated and sent by the timer 460 through the first AND-type logic gate 480 and the logic latch 490 in order to control the third switch 440 so as to be closed.

This brings about the limiting of the intensity of the current flowing in the first switch 420 to a small value, preferably smaller than the nominal value by 75 to 90%, by virtue of the feedback of the current measurement by the current measurement unit 450, to the second input of the first driver 400, which input is compared with an internal reference inside said first driver 400 corresponding to a smaller current.

The controlling of the transistor 30 so as to be in the on state by the driving module 40 is therefore performed, in a step E3, on the basis of a control current the intensity of which is limited to a predefined value lower than the intensity of the first control current, by virtue of the feedback of the measurement by the current measurement unit 450 to the first driver 400 through the third switch 440.

However, if the duration measured by the timer has not reached the predefined duration threshold at the moment when the control module 10 sends the control signal with the binary value 1 (step E1), the third switch 440 is not switched to the on state, because the logic latch 490 is set to zero by the binary value 1 coming from the second AND-type logic gate 485. The intensity of the current for switching the first switch 420 to the on state (ON) is then not limited and will retain its high initial value, for example of the order of 100 mA to 1 A.

It should be noted that, instead of the logic latch 190, delay circuits making it possible (like the RS-type logic latch 190) to prevent signals from switching simultaneously could be used.

The invention therefore advantageously makes it possible to reduce the electromagnetic interference usually generated by switching the transistor 30 to the on state on the basis of its nominal current.

The invention claimed is:

1. A method for reducing the electromagnetic interference produced during switching of a transistor (30) for switching a quasi-resonant DC-DC voltage converter (1), said converter (1) being equipped with a control module (10), an induction coil (20), a field-effect transistor (30), and a driving module (40) supplied by a power supply (ALIM), said field-effect transistor (30) having a drain (D), a source (S), and a gate (G), said gate (G) being connected to the driving module (40), the driving module (40) equipped with a timer (460), and the control module (10) being configured to control the driving module (40) such that said driving module (40) controls the field-effect transistor (30), responsive to a control current, to be in either of an on state that allows passage of current between the drain (D) and the source (S), and an off state that blocks the current between the drain (D) and the source (S), the driving module (40) comprising a timer (460), the method comprising:

initially controlling the field-effect transistor (30) so as to be in the on state based on a first control current;

controlling (E1) the driving module (40) by means of the control module (10) so that said driving module (40) switches the field-effect transistor (30) to the off state at a first instant;

triggering (E2) the timer (460) at said first instant; and subsequent to said triggering (E2), when the triggered timer (460) reaches a predefined duration threshold, controlling (E3), by means of the driving module (40), the field-effect transistor (30) so as to be in the on state based on a second control current, where an intensity of the second control current is less than an intensity of the first control current, wherein, in an event where the triggered timer (460) does not reach the predefined duration threshold subsequent to said triggering (E2), then the field-effect transistor (30) is controlled with a current having the intensity of the first control current.

2. The method as claimed in claim 1, wherein the predefined duration threshold is between 5 and 50 μs.

3. The method as claimed in claim 1, wherein a decrease in the intensity of the first control current to the intensity of the second control current is of the order of 75 to 90%.

4. A quasi-resonant DC-DC voltage converter (1) for a motor vehicle, said converter (1) comprising:

a control module (10);

an induction coil (20);

a field-effect transistor (30); and a driving module (40) comprising a timer (460) and supplied with a current delivered by a power supply (ALIM), said field-effect transistor (30) comprising a drain (D), a source (S), and a gate (G), said gate (G) being connected to the driving module (40), the control module (10) being configured to control the driving module (40) in order that said driving module (40) controls the field-effect transistor (30) based on a control current so as to be in either of an on state that allows passage of current to pass between the drain (D) and the source (S), and an off state blocking the current between the drain (D) and the source (S), the control module (10) being configured to:

initially control the field-effect transistor (30) so as to be in the on state based on a first control current, control the driving module (40) so that said driving module (40) switches the field-effect transistor (30) to the off state at a first instant, trigger the timer (460) at said first instant, and subsequent to said first instant, when the triggered timer (460) reaches a predefined duration threshold, control the field-effect transistor (30), by means of the driving module (40), to be in the on state based on a second control current, where an intensity of the second control current is less than an intensity of the first control current, wherein, in an event where the triggered timer (460) does not reach the predefined duration threshold subsequent to the first instant, then the field-effect transistor (30) is controlled with a current having the intensity of the first control current.

5. The converter (1) as claimed in claim 4, wherein, if a duration elapsed between the first instant and a subsequent second instant is longer than the predefined duration threshold, the converter (1) decreases an intensity of the control current controlling the field-effect transistor (30) so as to be in the on state until a next switching of said field-effect transistor (30) to the off state.

6. The converter (1) as claimed in claim 5, wherein the driving module (40) comprises a first switch (420) and a second switch (430) which are connected in series via a midpoint (P1), said first switch (420) being connected on one side to the power supply (ALIM) and on another side to said midpoint (P1), said second switch (430) being connected on one side to the midpoint (P1) and on another side to ground (M).

7. The converter (1) as claimed in claim 6, wherein the first switch (420) is a transistor for switching the field-effect transistor (30) to the on state, and the second switch (430) is a transistor for switching the field-effect transistor (30) to the off state.

8. The converter (1) as claimed in claim 7, wherein the driving module (40) further comprises:
 a third switch (440);
 a first driver (400) configured to switch the first switch (420);
 a second driver (410) configured to switch the second switch (430);
 a driving unit (445) for driving the third switch (440), configured to switch said third switch (440); and
 a current measurement unit (450).

9. The converter (1) as claimed in claim 8, wherein the driving unit (445) comprises the timer (460), two NOT-type logic gates (470, 475), two AND-type logic gates (480, 485) and a logic latch (490).

10. A motor vehicle comprising a converter (1) as claimed in claim 4.

11. The method as claimed in claim 2, wherein the decrease in the intensity of the control current for controlling the transistor (30) is of the order of 75 to 90%.

12. A motor vehicle comprising a converter (1) as claimed in claim 5.

13. A motor vehicle comprising a converter (1) as claimed in claim 6.

14. A motor vehicle comprising a converter (1) as claimed in claim 7.

15. A motor vehicle comprising a converter (1) as claimed in claim 8.

16. A motor vehicle comprising a converter (1) as claimed in claim 9.

17. The method as claimed in claim 1,
 wherein the field-effect transistor (30) is controlled to switch to the on state by a first switch (420),
 wherein the field-effect transistor (30) is controlled to switch to the off state by a second switch (430),
 wherein a third switch (440), driven by a driving unit (445), regulates current passing through the first switch (420) when said first switch (420) controls the field-effect transistor (30) to be in the on state, and
 wherein a current measurement unit (450) measures current flowing in the third switch (440) when said third switch (440) is in an on state.

18. The method as claimed in claim 17, wherein the first switch (420) and the second switch (430) are connected in series via a midpoint (P1), said first switch (420) being connected on one side to the power supply (ALIM) and on another side to said midpoint (P1), said second switch (430) being connected on one side to the midpoint (P1) and on another side to ground (M).

19. The converter (1) as claimed in claim 4, wherein the driving module (40) comprises:
 a first switch (420) for controlling the field-effect transistor (30) to switch to the on state,
 a second switch (430) for controlling the field-effect transistor (30) to switch to the off state,
 a third switch (440), driven by a driving unit (445), that regulates current passing through the first switch (420) when said first switch (420) controls the field-effect transistor (30) to be in the on state, and
 a current measurement unit (450) that measures current flowing in the third switch (440) when said third switch (440) is in an on state.

20. The method as claimed in claim 19, wherein the first switch (420) and the second switch (430) are connected in series via a midpoint (P1), said first switch (420) being connected on one side to the power supply (ALIM) and on another side to said midpoint (P1), said second switch (430) being connected on one side to the midpoint (P1) and on another side to ground (M).

\* \* \* \* \*